United States Patent [19]
Togei

[11] 4,228,444
[45] Oct. 14, 1980

[54] SEMICONDUCTOR DEVICE
[75] Inventor: Ryoiku Togei, Kawasaki, Japan
[73] Assignee: Fujitsu Limited, Kanagawa, Japan
[21] Appl. No.: 947,050
[22] Filed: Sep. 29, 1978

Related U.S. Application Data
[63] Continuation of Ser. No. 794,518, May 6, 1977, abandoned.

[30] Foreign Application Priority Data
May 28, 1976 [JP] Japan ................... 51/62606
[51] Int. Cl.$^2$ .................................. H01L 29/80
[52] U.S. Cl. ........................... 357/22; 357/23; 357/13; 357/45
[58] Field of Search .............. 357/23, 22, 13, 45

[56] References Cited
U.S. PATENT DOCUMENTS 3,896,483  7/1975  Whelan ....................... 357/23
3,988,761  10/1976  Kanazawa ................... 357/23

Primary Examiner—Edward J. Wojciechowicz
Attorney, Agent, or Firm—Staas & Halsey

[57] ABSTRACT

On a semiconductor substrate (or layer) of one conductivity type, a semiconductor layer of the opposite conductivity type is formed and a source and a drain region of the same conductivity type as the semiconductor substrate are formed in the semiconductor layer. Junctions are respectively formed between the source and drain regions and the semiconductor layer at such positions where punch-through may easily occur between the source and drain regions and the semiconductor substrate when operating voltages are applied to these regions. A local potential distribution generation electrode, which makes an ohmic contact with the semiconductor layer, is formed between the source and drain regions. By applying voltages to both the local potential distribution generation electrode and a drain electrode at substantially the same time, a potential barrier normally formed in the semiconductor layer is removed, thereby to inject carriers from the source region to the drain region through the semiconductor substrate (or layer).

8 Claims, 6 Drawing Figures

SEMICONDUCTOR DEVICE

This is a continuation of application Ser. No. 794,518 filed May 6, 1977, now abandoned.

BACKGROUND OF THE INVENTION

1. Field of the Invention

The present invention relates to a semiconductor device and more particularly to a field effect semiconductor device.

2. Description of the Prior Art

In general, a field effect semiconductor device, for example, an insulating gate MIS field effect device, is complicated in its gate electrode structure and its manufacture involves many photolithographic processes in relation to the formation of other regions, for instance, source and drain regions, and is time-consuming and poor in yield. Further, the insulating gate MIS field effect device has the defect that speeding up of its operation is impossible because a portion of low carrier mobility must be used as one part of an active portion. Moreover, in a junction type field effect device and the above-mentioned insulating gate MIS field effect device, the elements are required to be isolated from the next adjacent ones by an insulating region or channel cut region formed therebetween, so that it is difficult to form these devices with high density.

SUMMARY OF THE INVENTION

The present invention is directed toward a field effect semicondutor device.

An object of the present invention is to provide a field effect semiconductor device which is easy to manufacture and possible to integrate with high density.

Another object of the present invention is to provide a field effect semiconductor device which is capable of high-speed operation.

A further object is to provide a field effect semiconductor device having source and drain regions with a local potential distribution generation electrode therebetween for the purpose of removing a potential barrier to permit the injection of carriers from the source to the drain region.

The above objects are accomplished by a semiconductor device which comprises a semiconductor substrate (or layer) of one conductivity type, a semiconductor layer of the opposite conductivity type formed thereon, a source and a drain region of the one conductivity type formed in the semiconductor layer so that junctions may be formed between them and the semiconductor layer at such positions where one part of each of the depletion layers normally appearing around the source and drain regions in the operative state of the device may easily reach the semiconductor substrate (or layer), and a local potential distribution generation electrode formed between the source and the drain regions to make an ohmic contact with the semiconductor layer. When this last electrode is connected to a suitable voltage, a potential barrier between the source and drain regions is removed to permit the injection of carriers from the source to the drain region.

DESCRIPTION OF THE PREFERRED EMBODIMENTS

Figure 1:
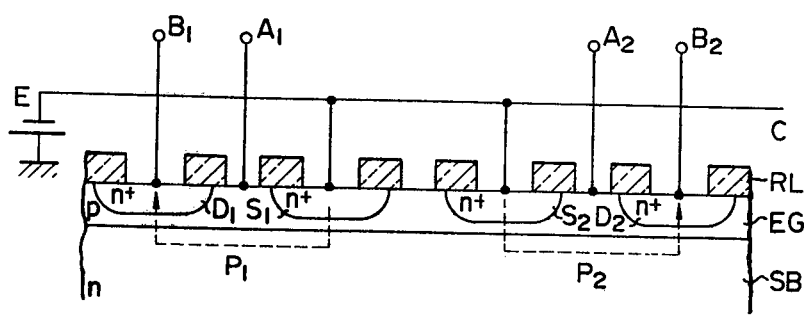
FIG. 1 is a sectional view illustrating the principal part of an embodiment of this invention.

FIG. 1 shows in section the principal part of an embodiment of the present invention. In FIG. 1 reference character SB indicates an n type silicon semiconductor substrate (or layer); EG designates an epitaxial growth p type silicon semiconductor layer; $S_1$, $S_2$ ... identify $n^+$ type source regions; $D_1$, $D_2$, ... denote $n^+$ type drain regions; RL represents an insulating layer such as silicon dioxide ($SiO_2$) film; C shows a line connecting together the source regions $S_1$, $S_2$...; $A_1$, $A_2$ ... (hereinafter represented by Ai) refer to local potential distribution generation electrodes; $B_1$, $B_2$ ... (hereinafter represented by Bi) indicate drain electrodes; E designates a constant-voltage source; and $P_1$, $P_2$ ... identify carrier paths.

In the above structure, the semiconductor substrate SB has an impurity concentration of $1 \times 10^{16 \sim 17}$[atoms/cm$^3$] or so and a resistivity of lower than 3[$\Omega$-cm]. The semiconductor layer EG, opposite in conductivity type to the semiconductor substrate SB, has a thickness of about 1 to 3 [$\mu$m] and an impurity concentration of approximately $1 \times 10^{14 \sim 15}$[atoms/cm$^3$]. The source regions $S_1$, $S_2$, ... and the drain regions $D_1$, $D_2$, ... each have a depth of about 0.5 to 2 $\mu$m and an impurity concentration of approximately $1 \times 10^{20 \sim 21}$[atoms/cm$^3$]. The distance between the source regions $S_1$, $S_2$, ... or the drain regions $D_1$, $D_2$, ... and the semiconductor substrates SB is set to be less than 1 [$\mu$m]. It is also possible to form high impurity concentration regions ($p^+$ type) in the semiconductor layer EG at the sites for the connection of the local potential distribution generation electrodes (hereinafter referred to as the $^{LPDG}$/electrodes) $A_1$, $A_2$, ... to provide ohmic contacts between the LPDG electrodes and the semiconductor layer.

In the present embodiment, the operation is performed by the flow of carriers, that is, electrons, in the carrier paths $P_1$, $P_2$, ... indicated by the broken line arrows. Next, the operation of the device will be described in connection with the element portion including the source region $S_2$ and the drain region $D_2$.

Figure 2:
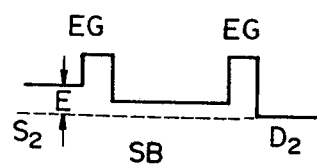
FIGS. 2 and 3 are diagrams showing potential distributions at principal portions of the embodiment depicted in FIG. 1.

Assuming that no voltages are applied to the LPDG electrode $A_2$ and the drain electrode $B_2$, the potential distribution along the carrier path $P_2$ is as shown in FIG. 2. That is, there exists between the $n^+$ type source and drain electrodes $S_2$ and $D_2$ respectively and the semiconductor substrate SB a potential barrier arising from the presence of the semiconductor layer EG. Accordingly, in this state, no carrier flows.

Figure 3:
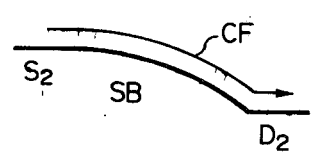

Then, voltages are applied to the LPDG electrode $A_2$ and the drain electrode $B_2$ at substantially the same time. In this case, voltage applied to the LPDG electrode $A_2$ is lower than the voltage applied to the drain electrode $B_2$. Upon application of the voltages to these electrodes, depletion layers are formed around the source region $S_2$ and the drain region $D_2$ and these depletion layers are caused to reach the semiconductor substrate SB. That is, the punch-through is achieved. This can be accomplished by a suitable selection of the voltages applied to the LPDG electrode $A_2$ and the drain electrode $B_2$. The potential distribution along the carrier path $P_2$ in this state is as seen in FIG. 3. In this case, the potential barrier seen in FIG. 2 is eliminated and the essential carrier path $P_2$ is formed through which carriers from the source region $S_2$ are injected into the semiconductor substrate SB, and the carriers reach the drain region $D_2$ through a channel in the semiconductor substrate SB, thus flowing a current to perform a switching operation. In FIG. 3, the arrow CF indicates the carrier flow.

Figure 4:
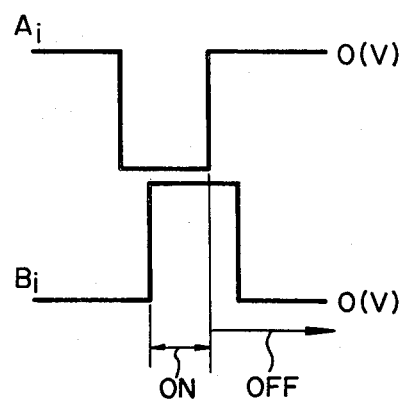
FIG. 4 is a timing chart in the case of applying voltages to the device of this invention.

According to one of our experiments in which the thickness of the silicon semiconductor layer EG is 3 [$\mu$m], the junction depth of the source and drain regions are 2.2 [$\mu$m], the voltage applied to the LPDG electrode Ai was 0 or $-5$ to $-10$ [V] with a pulse width of 10 [ns], the voltage applied to the drain electrode Bi was 0 or $+10$ to $+20$ [V] with a pulse width of 10 [ns], the voltage of the constant-voltage source E is 0.1 to 1 [V], and the timing for applying the voltages to the LPDG electrode Ai and the drain electrode Bi is such as shown in FIG. 4, that is, the voltage is applied to the LPDG electrode Ai earlier than the voltage application to the drain electrode Bi by about 3 [ns] and removed a little earlier than the latter, the field effect semiconductor device of the present invention performed excellently in operation.

Figure 5:
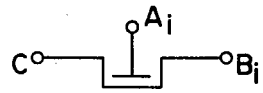
FIG. 5 is a diagram using a symbol to show the device of this invention.
Figure 6:
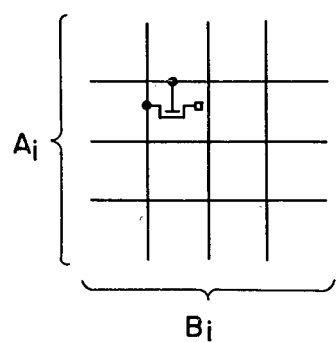
FIG. 6 is a circuit diagram illustrating one part of a memory using the symbol.

The symbol of the device of this invention is shown in FIG. 5 and one part of a matrix configuration of a possible memory circuit using the symbol is illustrated in FIG. 6. The device of this invention is of particular utility in a logic circuit. In the case of using the device of this invention as a memory cell, however, it can be employed, for instance, as the so-called one-transistor one-capacitor memory (refer to, for example, "Electronics", vol. 44, pp 69 to 73, Aug. 2, 1971). Further, a circuit similar to a static memory employing an ordinary MOS transistor (refer to, for instance, "Solid-State Design", vol. 6, Jan. 21, 1965) can be constructed. In the case of forming a logic circuit, it is possible to construct a circuit similar to a logic circuit employing an ordinary MOS transistor (refer to, for example, "MOS FET in Circuit Design", pp 103 to 107, McGraw-Hill, New York, 1967).

The device of the present invention has the following structural and operational advantages:

(a) Since the device of the present invention is very simple in construction, it is suited to mass production and can be formed with high density. For example, the LPDG electrodes $A_1$, $A_2$, . . . are only to control a potential barrier such as shown in FIG. 2, so that a complicated structure such as, for example, a gate electrode of a MIS field effect semiconductor device is not needed and the LPDG electrodes may be those which can make an ohmic contact with the semiconductor layer EG.

(b) The voltage applied to a predetermined one of the LPDG electrodes, for instance, $A_2$, hardly exerts any influence upon another element portion, for example portion including the source and drain regions $S_1$ and $D_1$, and the device does not use the boundary surface of the semiconductor layer EG as a channel, so that there is substantially no possibility of the generation of leakage between elements in the boundary surface as in the case of, for instance, a MIS type element. Accordingly, there is no need of adding an element isolation region or a structure corresponding thereto and, even if such is provided, it may be only in one direction, so that the provision of such region is very easy.

(c) The portion serving as a channel is formed in the semiconductor substrate (or layer) SB of relatively high impurity concentration, that is, in the bulk, and the carrier mobility is remarkably high, so that the switching speed can be raised high.

It will be apparent that many modifications and variations may be effected without departing from the scope of novel concepts of the present invention.

What is claimed is:

1. A semiconductor device comprising:
a semiconductor substrate of one conductivity type;
a semiconductor layer of the opposite conductivity type formed on the semiconductor substrate;
a source region and a drain region of the one conductivity type formed in the semiconductor layer of such depth therein as to be close to but not touching said semiconductor substrate so that junctions may be formed between them and the semiconductor layer, respectively, at such positions where a part of each of the depletion layers appearing around the source and drain regions during operation may easily reach the semiconductor substrate;
a local potential distribution generation electrode formed between the source and the drain regions to make an ohmic contact with the semiconductor layer; and,
the device characterized in that during operation a channel is set up between the source and drain regions with the depletion layers extending from the source and the drain regions to the semiconductor substrate within that portion of the semiconductor substrate where the depletion layers reach.

2. A semiconductor device comprising:
a semiconductor substrate of one conductivity type;
a semiconductor layer of the opposite conductivity type formed on the semiconductor substrate;
source and drain regions of the one conductivity type formed in the semiconductor layer;
said source and drain regions being close to said semiconductor substrate but not in contact therewith so that during operation of the device, depletion layers will be associated with the junctions of said regions and said semiconductor substrate; and,
means for controlling the widths of the depletion layers extending from said source region and said drain region in said semiconductor layer to permit the injection of carriers from said source region to said drain region through a channel effected in the semiconductor substrate.

3. A semiconductor device as in claim 2, wherein said means for controlling the widths of the depletion layers extending from said source region and said drain region in said semiconductor layer includes an electrode provided between said source and drain regions having ohmic contact with said semiconductor layer.

4. A semiconductor device as in claim 3, wherein said semiconductor layer is about 3 $\mu$m thick, and the respective source and drain regions formed therein are about 2.2 $\mu$m deep.

5. A semiconductor device as in claim 3, wherein overlapping voltages of opposite polarity are applied to said drain region and said electrode to effect the desired operation.

6. A semiconductor device as in claim 5, wherein the voltage applied to said drain region consists of 10 to 20 volts positive pulses having a width of about 10 ns, the voltage applied to the electrode having ohmic contact with the semiconductor layer consists of 5 to 10 volts negative pulses having a width of about 10 ns, and the timing of the overlapping voltages being such that the pulses to the electrode are earlier than the pulses to the drain region.

7. A semiconductor device as in claim 4 or 6, wherein a plurality of pairs of source and drain regions are provided in said semiconductor layer, and each pair of regions is provided with one of said electrodes.

8. A semiconductor device as in claim 6, wherein a constant voltage source of 0.1 to 0.1 volts is applied to the source region of the device.

* * * * *

UNITED STATES PATENT AND TRADEMARK OFFICE
CERTIFICATE OF CORRECTION

PATENT NO. : 4,228,444
DATED : October 14, 1980
INVENTOR(S) : Ryoiku Togei

It is certified that error appears in the above—identified patent and that said Letters Patent is hereby corrected as shown below:

Column 2, line 39, "substrates" should be --substrate--;

line 44, "$LPDG$/electrodes" should be --LPDG electrodes--.

Column 3, line 61, after "example" insert --the element--.

Column 6, line 6, (claim 8), "0.1 to 0.1" should be --0.1 to 1.0--.

Signed and Sealed this

Seventh Day of April 1981

[SEAL]

Attest:

RENE D. TEGTMEYER

Attesting Officer    Acting Commissioner of Patents and Trademarks